United States Patent
Guo et al.

(10) Patent No.: US 8,058,697 B2
(45) Date of Patent: Nov. 15, 2011

(54) SPIN TRANSFER MRAM DEVICE WITH NOVEL MAGNETIC SYNTHETIC FREE LAYER

(75) Inventors: Yimin Guo, San Jose, CA (US); Cheng Horng, San Jose, CA (US); Ru-Ying Tong, Los Gatos, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 910 days.

(21) Appl. No.: 11/728,491

(22) Filed: Mar. 26, 2007

(65) Prior Publication Data

US 2008/0239589 A1      Oct. 2, 2008

(51) Int. Cl.
*H01L 29/82* (2006.01)
*G11C 11/02* (2006.01)

(52) U.S. Cl. ........... 257/421; 438/3; 257/422; 257/423; 257/427; 257/E29.323; 360/324.2; 365/157; 365/171

(58) Field of Classification Search ............... 257/9, 20, 257/414, 421–427, E29.323; 438/3; 360/324–326, 360/313; 365/157–158, 171–173; 39/737
See application file for complete search history.

(56) References Cited

U.S. PATENT DOCUMENTS

| | | | |
|---|---|---|---|
| 5,695,864 | A | 12/1997 | Slonczewski |
| 6,532,164 | B2 | 3/2003 | Redon et al. |
| 6,714,444 | B2 | 3/2004 | Huai et al. |
| 7,067,331 | B2 | 6/2006 | Slaughter et al. |
| 7,083,988 | B2 | 8/2006 | Deak |
| 7,126,202 | B2 | 10/2006 | Huai et al. |
| 2002/0055016 | A1* | 5/2002 | Hiramoto et al. ............ 428/692 |
| 2005/0189574 | A1* | 9/2005 | Nguyen et al. ............... 257/295 |
| 2006/0038213 | A1* | 2/2006 | Mori et al. ................... 257/295 |
| 2006/0141640 | A1 | 6/2006 | Huai et al. |
| 2009/0121266 | A1* | 5/2009 | Pietambaram et al. ....... 257/295 |

OTHER PUBLICATIONS

Slonczewski, Phys. Rev. B, vol. 39(10), 6995, 1989.*
Ji et al., Physical Review Letters, vol. 90(10) Mar. 14, 2003.*
Co-pendning U.S. Patent "Spin Transfer MRAM Device with Novel Magnetic Free Layer", U.S. Appl. No. 11/717,347, filed Mar. 13, 2007, by Yimin Guo et al.
"Direct-Current Induced Dynamics in $Co_{90}Fe_{10}/Ni_{80}Fe_{20}$ Point Contacts", by W.H. Rippard et al., Physical Review Letters, vol. 92, No. 2, wkending Jan. 16, 2004, pp. 027201-1 to 027201-4.
"Current-driven excitation of magnetic multilayers", by J.C. Slonczewskim Jrnl. of Magnetism and Magnetic Materials 159(1996)L1-L7.
"Sein-current interaction with a monodomain magnetic body: A model study", Physical Review B, vol. 62, No. 1, Jul. 1, 2000-1, by J.Z. Sun, pp. 570-578.

* cited by examiner

*Primary Examiner* — Bradley K Smith
*Assistant Examiner* — Jami M Valentine
(74) *Attorney, Agent, or Firm* — Saile Ackerman LLC; Stephen B. Ackerman

(57) ABSTRACT

We describe a CPP MTJ MRAM element that utilizes transfer of spin angular momentum as a mechanism for changing the magnetic moment direction of a free layer. The device includes a tunneling barrier layer of MgO and a non-magnetic CPP layer of Cu or Cr and utilizes a novel synthetic free layer having three ferromagnetic layers mutually exchange coupled in pairwise configurations. The free layer comprises an inner ferromagnetic and two outer ferromagnetic layers, with the inner layer being ferromagnetically exchange coupled to one outer layer and anti-ferromagnetically exchange coupled to the other outer layer. The ferromagnetic coupling is very strong across an ultra-thin layer of Ta, Hf or Zr of thickness preferably less than 0.4 nm.

13 Claims, 2 Drawing Sheets

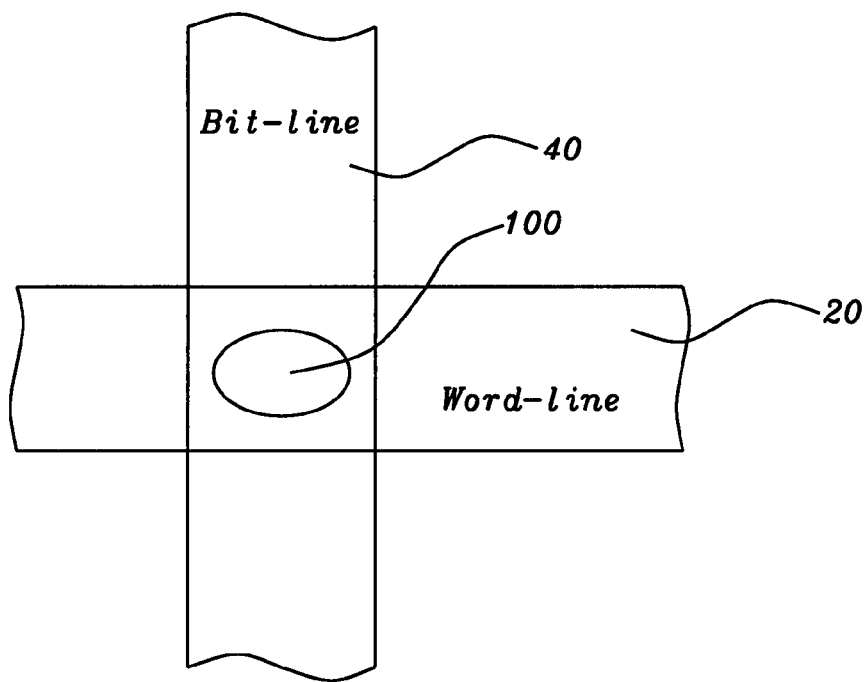
FIG. 1
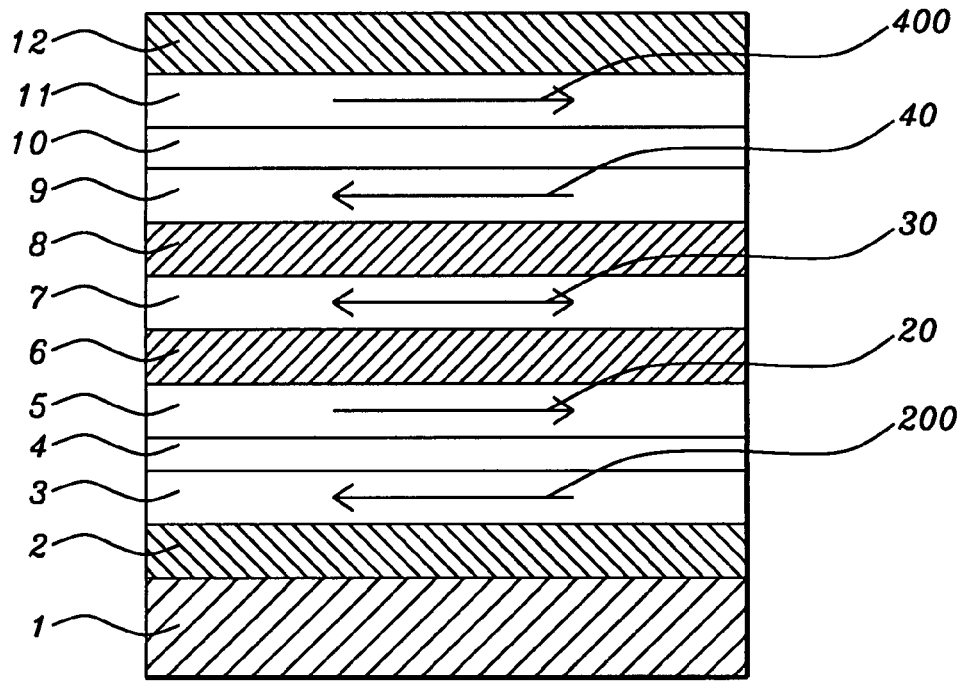
FIG. 2 - Prior Art

SPIN TRANSFER MRAM DEVICE WITH NOVEL MAGNETIC SYNTHETIC FREE LAYER

RELATED PATENT APPLICATION

This Application is related to Ser. No. 11/717,347, filed Mar. 13, 2007 and assigned to the same assignee as the present invention.

BACKGROUND OF THE INVENTION

1. Field of the Invention

This invention relates generally to a current perpendicular to plane random access memory (CPP-MRAM) cell formed as a magnetic tunneling junction (MTJ)) and using a spin transfer effect with enhanced spin torque.

2. Description of the Related Art

The conventional magnetic tunneling junction (MTJ) device is a form of ultra-high giant magnetoresistive (GMR) device in which the relative orientation of the magnetic moments of parallel, vertically separated, upper and lower magnetized layers controls the flow of spin-polarized electrons tunneling through a very thin dielectric layer (the tunneling barrier layer) formed between those layers. When injected electrons pass through the upper layer they are spin polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of multi-state resistor, since different relative orientations (for example, parallel and antiparallel) of the magnetic moments will change the magnitude of a current passing through the device. In a common type of device configuration (spin filter), one of the magnetic layers has its magnetic moment fixed in direction (pinned) by exchange coupling to an antiferromagnetic layer, while the other magnetic layer has its magnetic moment free to move (the free layer). Thus, such a device is a two state resistor. The magnetic moment of the free layer is then made to switch its direction from being parallel to that of the pinned layer, whereupon the tunneling current is large, to being antiparallel to the pinned layer, whereupon the tunneling current is small. The switching of the free layer moment direction (writing) is accomplished by external magnetic fields that are the result of currents passing through conducting lines adjacent to the cell.

FIG. 1 is a highly schematic drawing showing an overhead view of a conventional MRAM cell between orthogonal word and bit lines. The cell is drawn with a slightly elliptical horizontal cross-section because such a shape produces a magnetic anisotropy within the free layer that assists its magnetic moment in retaining a thermally stable fixed position after switching fields have been turned off. The fields produced by currents in each of the two lines are between about 30 to 60 Oersteds in magnitude. According to the diagram, the word line field will be along the hard axis of the cell, the bit line field will be along the easy axis.

The use of magnetic fields externally generated by current carrying lines to switch the magnetic moment directions becomes problematic as the size of the MRAM cells decreases and, along with their decrease, so does the width of the current carrying lines. The smaller width lines require greater currents to produce the necessary switching fields, greatly increasing power consumption.

For this reason, a new type of magnetic device, called a spin transfer device and described by Slonczewski, (U.S. Pat. No. 5,695,164), has been developed and seems to eliminate some of the problems associated with the excessive power consumption necessitated by external switching fields. The spin transfer device shares some of the operational features of the conventional MTJ cell described above, except that the switching of the free layer magnetic moment is produced by the spin polarized current itself. In this device, unpolarized conduction electrons passing through a first magnetic layer having its magnetic moment oriented in a given direction (such as the pinned layer) are preferentially polarized by their passage through that layer by a quantum mechanical exchange interaction with the polarized bound electrons in the layer. Such a polarization can occur to conduction electrons that reflect from the surface of the magnetized layer as well as to those that pass through it. When such a stream of polarized conduction electrons subsequently pass through a second magnetic layer whose polarization direction is not fixed in space (a free layer), the polarized conduction electrons exert a torque on the bound electrons in the magnetic layer which, if sufficient, can reverse the polarization of the bound electrons and, thereby, reverse the magnetic moment of the magnetic layer. If the magnetic moment of the layer is directed along its easy magnetic axis, the required torque is minimized and the moment reversal occurs most easily. The use of a current internal to the cell to cause the magnetic moment reversal requires much smaller currents than those required to produce an external magnetic field from adjacent current carrying lines to produce the moment switching. Recent experimental data (W. H. Rippard et al., Phys. Rev. Lett., 92, (2004)) confirm magnetic moment transfer as a source of magnetic excitation and, subsequently, magnetic moment switching. These experiments confirm earlier theoretical predictions (J. C. Slonczewski, J. Magn. Mater., 159 (1996) LI, and J. Z. Sun, Phys. Rev. B., Vol. 62 (2000) 570). These latter papers show that the net torque, $\Gamma$, on the magnetization of a free magnetic layer produced by spin-transfer from a spin-polarized DC current is proportional to:

$$\Gamma = sn_m \times (n_s \times n_m), \quad (1)$$

Where s is the spin-angular momentum deposition rate, $n_s$ is a unit vector whose direction is that of the initial spin direction of the current and $n_m$ is a unit vector whose direction is that of the free layer magnetization and x represents a vector cross product. According to the equation, the torque is maximum when $n_s$ is orthogonal to $n_m$.

Huai et al. (U.S. Pat. No. 6,714,444) describes a device utilizing spin transfer which is schematically illustrated in FIG. 2. This storage device consists of an underlayer (1), a first antiferromagnetic pinning layer (2), a first pinned ferromagnetic layer (3), a first non-magnetic spacer layer (4), a pinned ferromagnetic reference layer (5), a non-conducting tunneling barrier layer (6), a ferromagnetic free layer (7) (the storage layer), a non-magnetic layer (8), a pinned magnetic drive layer (9), a second non-magnetic spacing layer (10), a second pinned layer (11) and a second antiferromagnetic pinning layer (12) that pins the second pinned layer. Arrows drawn in the various layers, (200), (20), (30), (40) and (400), in the order of the layers discussed above, are exemplary magnetic moment directions. The double-headed arrow (30) in layer (7) indicates that this layer is free to have its magnetic moment directed in either of two directions.

Referring again to FIG. 2 it is noted that when the current is directed from bottom to top (layer (1) to layer (12)), conduction electrons are moving from top to bottom and will first pass through drive layer (9) before entering free layer (7). Therefore, the free layer magnetization would be switched to the direction of the drive layer's magnetization by the spin-transfer torque when the current density is larger than a critical value. Conversely, if the current is directed from top to bottom, the free layer magnetization would be switched to the direction of the pinned reference layer (5), since the conduction electrons have passed through that layer before entering the free layer.

In a typical prior art embodiment of the device shown in FIG. 2, the tunnel barrier layer (6) is a layer of $AlO_x$ (aluminum oxide), while non-magnetic layer (8) is a thin layer of Cu. The portion of the structure in FIG. 1 from layer (7) to (12) inclusive, is a CPP spin valve structure. The portion of the structure from (2) to (7) inclusive is a CPP magnetic tunneling (MTJ) structure in a spin filter configuration. Conduction electrons therefore, act on the free layer both by transmission (of the majority polarized electrons) and reflection (of the minority oppositely polarized electrons). Therefore, two spin torques would act on the free layer at the same time to minimize the required spin-transfer current.

The use of the spin transfer effect is also to be found in other prior art examples. Redon et al. (U.S. Pat. No. 6,532, 164) discloses magnetic switching using spin transfer. Huai et al. (U.S. Pat. No. 7,126,202) discloses a spin transfer device that includes a thermal stabilization layer to maintain switched magnetic moment directions free from the thermal perturbations that can change the switched directions in a cell of small size.

The design of FIG. 1 has certain disadvantages if the tunneling barrier layer (6) is formed of MgO and the free layer (7) is CoFeB, which give very high values of DR/R (the magnetoresistance ratio, where DR is the difference between the maximum and minimum resistances of the device and R is the minimum resistance). A problem arises if the non-magnetic layer (8) is then formed of Cu, because such a layer deposited directly on top of the CoFeB free layer (7) would degrade DR/R as well as the spin momentum deposition rate s, (see equ. (1) above).

The use of CoFeB in conventional MRAM devices is well known in the prior art. Deak (U.S. Pat. No. 7,083,988) disclose a free layer comprising amorphous CoFeB and also amorphous CoFeB with a thin layer of Ta formed thereon. Slaughter et al. (U.S. Pat. No. 7,067,331) discloses free layers formed as laminations of CoFeB with Ru or Rh between the layers.

Since a low critical spin transfer current also requires a low magnetic moment of the free layer (7), which yields a lower energy barrier to the flipping of the magnetization direction, thermal instability (fluctuations in magnetization caused by thermal energy transfers) becomes a problem when the size of the MRAM cell becomes very small and domain structures do not provide the necessary stabilization. A conventional single ferromagnetic free layer patterned to a nanometer-scale shape appears to be unable to meet the required thermal stability condition, which is: $E/k_B T > 40$, where E is the energy barrier for magnetization flipping, T is the ambient temperature and $k_B$ is the Boltzmann constant. A synthetic ferromagnetic free layer is expected to satisfy this condition since such a structure consists of two ferromagnetic layers separated by a non-magnetic spacer layer, such as a layer of Ru, and the magnetization directions of the two layers are antiparallel, so that the resulting layer has a magnetic moment that is substantially zero, thereby presenting a substantially zero demagnetization field which helps the structure to withstand thermal fluctuations.

The present invention will describe a spin transfer MRAM device in which a new form of free layer will address the problems cited above.

SUMMARY OF THE INVENTION

A first object of this invention is to provide a CPP-MTJ configured MRAM device of the spin transform variety in which the ratio DR/R is significantly enhanced.

A second object of the present invention is to provide such a device in which the spin angular momentum deposition rate is increased.

A third object of the present invention is to provide a CPP-MTJ configured MRAM device in which the critical spin transfer current density is reduced.

A fourth object of the present invention is to provide a thermally stable MRAM cell of small cross-sectional size.

These objects will be met by a device design in which MgO serves as a tunneling barrier layer in the MTJ portion of the device, Cr (or Cu) serves as the spacer layer in the spin-valve GMR portion of the device and the free layer is a synthetic exchange coupled lamination. This lamination includes two ferromagnetic layers exchange coupled across a non-magnetic layer in an antiparallel configuration of their magnetic moments (forming a synthetic anti-ferromagnetic structure) and thereby having a substantially zero net magnetic moment. This synthetic structure is then separated by a thin layer of Ta, Zr or Hf from a single ferromagnetic layer of CoFeB whose magnetization is parallel to the magnetization of its immediately adjacent ferromagnetic layer in the synthetic anti-ferromagnetic structure, thereby strongly exchange coupling to that layer (forming a synthetic ferromagnetic structure). This arrangement is seen in FIG. 4, which will be fully discussed below. This novel synthetic free layer interacts with the spin magnetic moments of a flow of conduction electrons both by transmission and reflections, thereby minimizing the magnitude of the current required to change the free layer magnetic moment.

BRIEF DESCRIPTION OF THE DRAWINGS

FIG. 1 is a schematic representation of a prior-art MTJ MRAM device located at the junction of word and bit lines.

FIG. 2 is a schematic cross-sectional view of a prior art spin-transfer device.

DESCRIPTION OF THE PREFERRED EMBODIMENTS

The preferred embodiment of the present invention is an MRAM device of the spin-transfer variety, having a CPP-MTJ configuration and including a free layer formed as a synthetic anti-ferromagnetically exchange coupled lamination of two ferromagnetic layers (preferably CoFe and CoFeB), then further exchange coupled by parallel magnetization coupling across a very thin layer of Ta, Zr or Hf to yet a third ferromagnetic layer of CoFeB to form a strongly exchange coupled synthetic ferromagnetic configuration. This free layer has a particularly advantageous form for a change in its magnetic moment to be effected by the transfer of spin magnetic moments of conduction electrons both by transmission and reflection.

Figure 3:
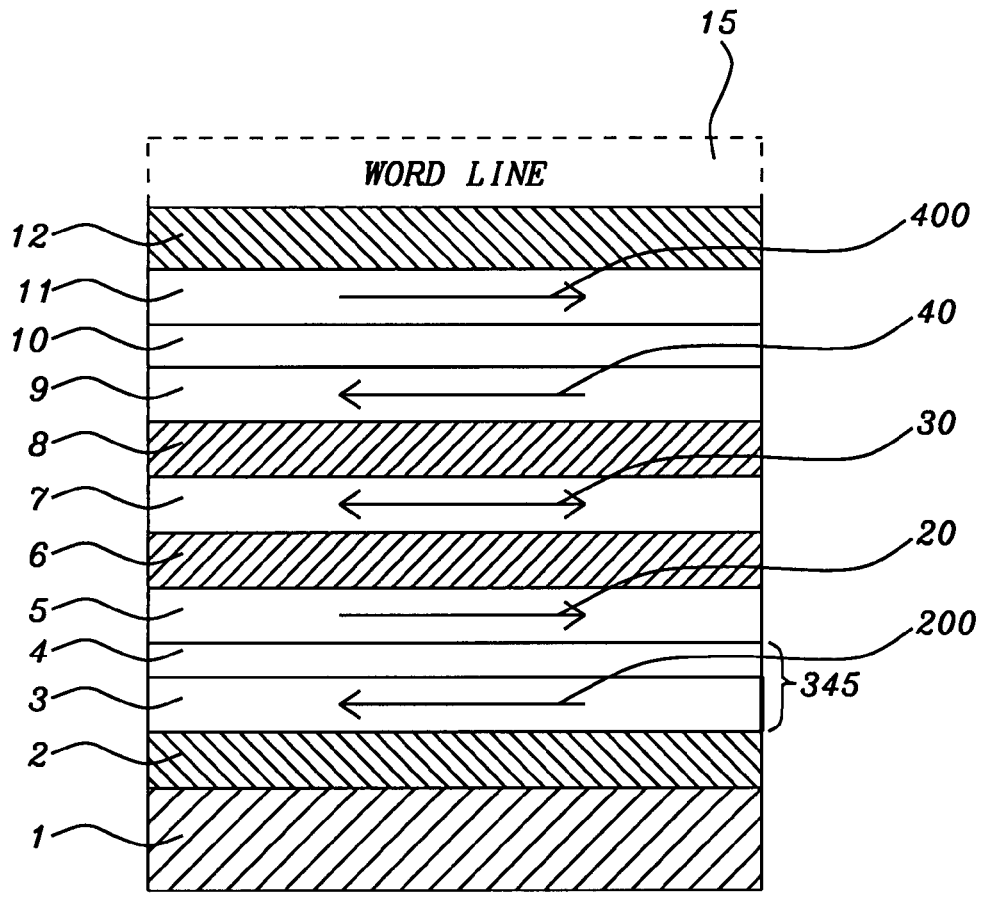
FIG. 3 is a schematic cross-sectional view of the device of the present invention.

Referring to FIG. 3, there is seen a schematic cross-sectional view of the device of the present invention. Looking at the structure from the bottom upward, there is shown the following sequence of layers. Layer (1) is a substrate or underlayer. Layer (2), formed on the substrate, is a magnetic pinning layer formed of an antiferromagnetic (AFM) material such as MnPt, IrMn, FeMn or NiO. Layers (3), (4) and (5) together form a exchange coupled structure, collectively denoted (345), in which layer (3) is pinned to anti-ferromagnetic layer (2) by an exchange coupling mechanism and layer (5) is pinned to layer (3) by an exchange coupling mechanism in which non-magnetic spacer layer (4), that can be a layer of Ru, Rh or Cr, serves as the coupling layer. As the arrows (200) and (20) depicting magnetization directions indicate, layers (3) and (5) are coupled in an anti-parallel configuration so that the (345) structure is a synthetic anti-ferromagnetic layer. Conventionally, layer (3) is denoted a pinned layer and layer (5) is denoted a reference layer. Note, however, that layer (5) is also pinned in direction, but its particular role is to provide a fixed reference direction relative to the magnetization of the free layer so as to produce a tunneling junction current varying effect. Layer (5) is typically formed of CoFeB, but, layer (5) can itself be a three layer synthetic anti-ferromagnetic structure comprising two ferromagnetic layers of alloys of Ni, Fe, Co and B, separated by a coupling layer of Ru, Rh or Cr.

Layer (6) is a tunneling barrier layer, formed of the dielectric material MgO. Layer (7) is a magnetically free layer, denoted herein a storage layer, whose magnetic moment (30) direction (shown as a two-headed arrow to indicate its two possible directions), either along arrow (20) or opposite to it, determines a stored bit of magnetic information, hence denoting layer (7) as a storage layer.

Figure 4:
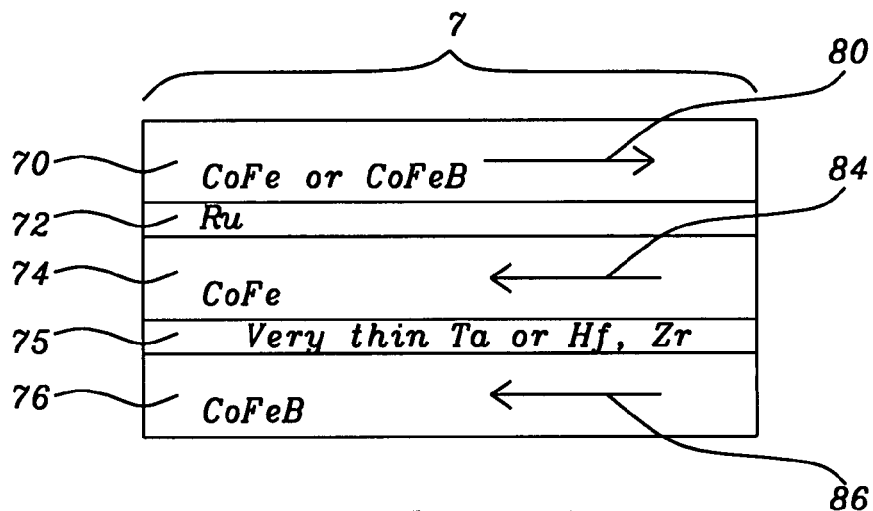
FIG. 4 is a schematic cross-sectional view of the free layer of the present device

FIG. 4 is a schematic illustration of the structure of the free (or "storage") layer (7), showing it to be a synthetic lamination comprising three magnetically exchange coupled ferromagnetic layers (coupled in mutually pairwise configurations), (70), (74) and (76), with layer (76) being formed on layer (6) of FIG. 3, the barrier layer. Layer (70) is a layer of CoFe or CoFeB and layer (74) is a layer of CoFe. They are separated by a layer (72) of Ru and magnetically coupled across the Ru layer by means of their magnetizations being in antiparallel directions (shown as arrows (80) and (84)). The CoFe layer (74) is then further magnetically exchange coupled to a layer of CoFeB (76) across a very thin layer (75) of Ta, Zr or Hf. Because of the thinness of (75), layer (76) and layer (74) have very strongly coupled parallel magnetizations (arrows (86) and (84)) so the exchange coupling is a very strong parallel (ferromagnetic) coupling. As noted, the Ta, Zr or Hf layer (75) is of sufficient thinness (preferably equal to or less than approximately 0.4 nanometers) so that the two layers (74) and (76) are strongly coupled by a parallel exchange force. This new free layer structure is thermally stable and retains a high DR/R and spin-angular momentum deposition rate when used with an MgO tunneling barrier layer (layer (6) in FIG. 3).

Returning to FIG. 3, there is next seen a thin non-magnetic layer (8), which is preferably a layer of Cr (or Cu or other suitable non-magnetic electrically conducting material), that serves as a spacer layer between the storage layer (7) and a pinned drive layer (9). The drive layer, which is a layer of ferromagnetic material such as CoFeB, will serve as a mechanism for polarizing conduction electrons that pass through it. When such polarized electrons traverse layer (8), retaining their polarization because of the thinness of layer (8), and strike layer (7), they transfer their individual (microscopic) spin angular momenta to the macroscopic magnetic moment of the layer (7), producing a directional change of that macroscopic quantity if the total current exceeds a critical amount. As noted above, for a maximally efficient transfer of spin angular momentum, which requires a minimum current, the transfer should occur both on transmission and reflection.

Layer (10) is a non-magnetic coupling layer, such as a layer of Ru, Rh or Cr, serving to allow an anti-ferromagnetic coupling of the magnetizations of layer (9) (arrow (40)) and the magnetization of layer (11) (arrow (400)), which is a ferromagnetic layer pinned to anti-ferromagnetic layer (12). It is noted that all magnetized layers are magnetized in the plane of their deposition. It is further noted that storage layer (7) is formed with a crystalline uni-axial anisotropy to produce an axis along which a magnetization direction is thermally stable. It is still further noted that an electrically conductive bit line (15) is formed on top of the cell to produce a magnetic field that will bias the cell and can, thereby, pre-dispose it to change or retain the direction of its free layer magnetization.

The preferred form of the present invention, consistent with the description given above, is therefore configuration A:
A) AFM/CoFe (or CoFeB)/Ru/CoFeB/MgO/free layer/Cr (or Cu)/CoFe (or CoFeB)/Ru/CoFe,
Where the "free layer" is the synthetic multi-layered structure of configuration B:
B) CoFeB/Ta (or Hf or Zr)/CoFe/Ru/CoFeB (or CoFe)
with the CoFeB and CoFe layers sandwiching the thin Ta (or Hf or Zr) layer having very strong parallel, exchange coupled, magnetizations (due to the thinness of the Ta, Hf or Zr layer) and the CoFe and CoFeB (or CoFe) layers sandwiching the Ru layer having anti-parallel exchange coupled magnetizations. In configuration A, the material layers have the following thicknesses.

The layers formed below the free layer:
CoFe (or CoFeB), between approximately 1.5 and 5.0 nm
Ru, approximately 0.8 nm
CoFeB (reference layer) between approximately 1.5 and 5.0 nm
MgO between approximately 0.5 and 2.0 nm
The free layer:
First CoFeB layer (contacting the MgO layer) is between approximately 1 and 2 nm, the Ta, Hf or Zr are between approximately 0.3 and 0.6 nm (less than 0.4 nm being preferred), the CoFe layer is between approximately 0.5 and 1.0 nm, the Ru layer is approximately 0.8 nm and the final CoFeB (or CoFe) layer is between approximately 1.0 and 3.0 nm.
The layers formed on the free layer:
Cr (or Cu) between approximately 1.0 and 7.0 nm
CoFe (or CoFeB) between approximately 1.5 and 5.0 nm
Ru, approximately 0.8 nm
CoFe between approximately 1.5 and 5.0 nm.

As is finally understood by a person skilled in the art, the preferred embodiments of the present invention are illustrative of the present invention rather than limiting of the present invention. Revisions and modifications may be made to methods, materials, structures and dimensions employed in forming and providing a CPP MTJ MRAM device using spin angular momentum transfer, while still forming and providing such a device and its method of formation in accord with the spirit and scope of the present invention as defined by the appended claims.

What is claimed is:

1. An MTJ MRAM device operating in a CPP configuration and utilizing the transfer of conduction electron spin angular momentum to change a free layer magnetization direction, comprising:
   a substrate;
   an MTJ element formed on said substrate, said element comprising a vertically stacked lamination of horizontal parallel layers including, therein, in the following order, an antiferromagnetic pinning layer, a pinned layer, a reference layer, a tunneling barrier layer, the free layer, a third conducting non-magnetic layer and a pinned drive layer, and wherein
   said free layer is a synthetic exchange coupled laminate consisting of a first layer of ferromagnetic material magnetically exchange coupled in a ferromagnic configuration across a first conducting non-magnetic layer to a second layer of ferromagnetic material; and wherein
   said second layer of ferromagnetic material is magnetically exchange coupled in an anti ferromagnetic configuration to a third ferromagnetic layer across a second conducting, non-magnetic layer and wherein,
   said third and said second ferromagnetic layers are magnetized in opposite directions within the horizontal planes of their formation and wherein
   said opposite directions are maintained by said exchange coupling and wherein said first ferromagnetic layer is magnetized within the horizontal plane of its formation in a direction parallel to that of said second ferromagnetic layer and wherein said magnetization of said first ferromagnetic layer is maintained by said exchange coupling in a direction parallel to said magnetization of said second ferromagnetic layer, and wherein
   said ferromagnetic layers are formed with a uni-axial magnetic anisotropy to assist in rendering said magnetization directions thermally stable and whereby,
   a flow of conduction electrons in the vertical direction can change the direction of magnetization of said free layer both by transmission through and reflection from said free layer by a transfer of spin torque between said flow of electrons and said free layer magnetizations.

2. The device of claim 1 further including an adjacent bit line, said bit line capable of producing a magnetic field to bias said device and facilitate changing the magnetization direction of said free layer by said transfer of spin torque between said conduction electrons and said magnetization.

3. The device of claim 1 wherein said free layer consists of:
   a first ferromagnetic layer of CoFeB that is formed on said tunneling barrier layer;
   a first layer of conducting non-magnetic material that is a layer of Ta or Hf or Zr formed on said first layer;
   a second ferromagnetic layer of CoFe formed on said first layer of conducting non-magnetic material;
   a second conducting non-magnetic material layer of Ru, formed on said second ferromagnetic layer;
   a third ferromagnetic layer of CoFe or CoFeB formed on said layer of Ru; and wherein,
   said first and second ferromagnetic layers are ferromagnetically exchange coupled with parallel directions of their magnetization, and wherein;
   said second and third ferromagnetic layers are antiferromagnetically exchange coupled with anti-parallel directions of their magnetizations.

4. The device of claim 3 wherein said first ferromagnetic layer of CoFeB is formed to a thickness between approximately 1 nm and 2 nm, wherein said first conducting non-magnetic layer of Ta, Hf or Zr, is formed to a thickness between approximately 0.3 and 0.6 nm, wherein said second ferromagnetic layer of CoFe is formed to a thickness between approximately 1 nm and 0.5 nm, wherein said second conducting non-magnetic layer of Ru is formed to a thickness of approximately 0.8 nm and wherein said third ferromagnetic layer of CoFe or CoFeB is formed to a thickness of between approximately 1.0 and 3.0 nm.

5. The device of claim 4 wherein said layer of Ta, Hf, or Zr is formed to a thickness that is less than approximately 0.4 nm.

6. The device of claim 1 wherein said reference layer is a layer of CoFeB formed to a thickness between approximately 1.5 and 5.0 nm.

7. The device of claim 1 wherein said reference layer is a synthetic antiferromagnetic layer comprising:
   a first layer of a soft magnetic alloy of Fe, Ni, Co and B;
   a second layer of a soft magnetic alloy of Fe, Ni, Co and B;
   a thin coupling layer of Ru, Rh or Cr formed therebetween; wherein
   said first and said second layers of soft magnetic alloy are magnetized in antiparallel directions by exchange coupling, forming, thereby, a synthetic anti-ferromagnetic layer.

8. The device of claim 1 wherein said drive layer is a layer of CoFeB formed to a thickness between approximately 1.5 and 5.0 nm.

9. The device of claim 1 wherein said drive layer is a synthetic antiferromagnetic layer comprising:
   a first layer of a soft magnetic alloy of Fe, Ni, Co and B;
   a second layer of a soft magnetic alloy of Fe, Ni, Co and B;
   a thin coupling layer of Ru, Rh or Cr formed therebetween; wherein
   said first and said second layers of soft magnetic alloy are magnetized in antiparallel directions by exchange coupling, forming, thereby, a synthetic anti-ferromagnetic layer.

10. The device of claim 1 wherein said drive layer is a multi-layered lamination comprising a plurality of layers of CoFe and CoFeB.

11. The device of claim 1 wherein said conducting non-magnetic layer is a layer of Cr formed to a thickness of between approximately 1.0-7.0 nm.

12. The device of claim 1 wherein said conducting non-magnetic layer is a layer of Cu formed to a thickness of between approximately 1.0-7.0 nm.

13. The device of claim 1 wherein said antiferromagnetic pinning layer is a layer of PtMn, IrMn, FeMn or NiO.

* * * * *